United States Patent [19]

Kato et al.

[11] Patent Number: 5,589,129

[45] Date of Patent: Dec. 31, 1996

[54] METHOD OF MANUFACTURING A MOLDING USING A FILLER OR AN ADDITIVE CONCENTRATED ON AN ARBITRARY PORTION OR DISTRIBUTED AT A GRADIENT CONCENTRATION

[75] Inventors: Tsuguo Kato, Fujisawa; Cao M. Thai, Yokohama, both of Japan

[73] Assignee: Kabushiki Kaisha Toshiba, Kawasaki, Japan

[21] Appl. No.: 491,687

[22] Filed: Jun. 19, 1995

Related U.S. Application Data

[63] Continuation of Ser. No. 198,262, Feb. 18, 1994, abandoned.

[30] Foreign Application Priority Data

Feb. 19, 1993 [JP] Japan .................................. 5-030161

[51] Int. Cl.$^6$ .................................................. B29C 35/08
[52] U.S. Cl. .................... 264/437; 264/451; 264/453; 264/478; 264/108; 264/272.17; 264/272.19; 264/328.12; 264/328.18; 425/174.6
[58] Field of Search ............................ 264/108, 328.12, 264/328.18, 437, 450, 451, 453, 478, 496, 272.13, 272.17, 272.19, 328.4, 328.2, 438, 439; 425/174.6, 174.8 R

[56] References Cited

U.S. PATENT DOCUMENTS

| | | | |
|---|---|---|---|
| 1,997,263 | 4/1935 | Meissner | 264/24 |
| 2,632,211 | 3/1953 | Trigg | 264/478 |
| 2,809,332 | 10/1957 | Sherwood | 264/272.19 |
| 2,878,353 | 3/1959 | Ely, Jr. et al. | 264/300 |
| 2,953,819 | 9/1960 | Holoubek et al. | 264/437 |
| 3,061,888 | 11/1962 | Wadham | 264/24 |
| 3,098,401 | 7/1963 | Breeze, Jr. et al. | 264/108 |
| 3,321,391 | 5/1967 | Warfield et al. | 264/22 |
| 3,393,257 | 7/1968 | Cable | 264/27 |
| 3,497,419 | 2/1970 | Winer et al. | 264/108 |
| 3,507,938 | 4/1970 | Hundsdiecker | 264/108 |
| 3,887,677 | 6/1975 | Deuter | 264/328.18 |
| 4,193,956 | 3/1980 | Kalnins | 264/27 |
| 4,252,513 | 2/1981 | Kalnins | 264/451 |
| 4,525,422 | 6/1985 | Butt et al. | 264/300 |
| 4,576,768 | 3/1986 | Markert et al. | 264/27 |
| 5,194,181 | 3/1993 | Reitz | 264/24 |

FOREIGN PATENT DOCUMENTS

| | | | |
|---|---|---|---|
| 2224271 | 12/1974 | France | 264/27 |
| 56-78145 | 6/1981 | Japan | 264/272.17 |
| 59-42928 | 3/1984 | Japan | 264/27 |
| 60-84723 | 5/1985 | Japan . | |
| 5-104549 | 4/1993 | Japan . | |

*Primary Examiner*—Jeffery R. Thurlow
*Attorney, Agent, or Firm*—Oblon, Spivak, McClelland, Maier & Neustadt, P.C.

[57] ABSTRACT

A liquid resin composition prepared by mixing an ionic material and/or a chargeable material into a thermosetting or thermoplastic resin is injected into a mold having a predetermined inner shape, and a DC voltage is applied to the liquid resin composition to concentrate the ionic material and/or chargeable material on a desired portion or to distribute the ionic material and/or chargeable material continuously. Thereafter, the resin composition is thermally cured when the resin composition contains the thermosetting resin, or the resin composition is hardened by cooling when the resin composition contains the thermoplastic resin, thereby obtaining a molding having a predetermined shape.

18 Claims, 1 Drawing Sheet

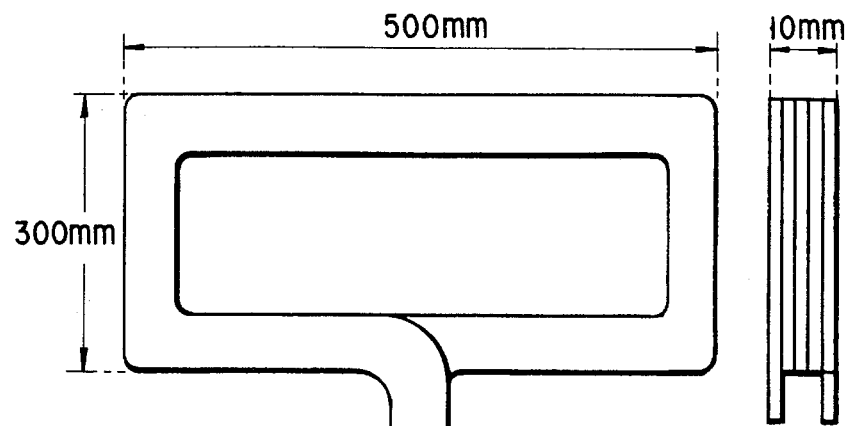
F I G. 1
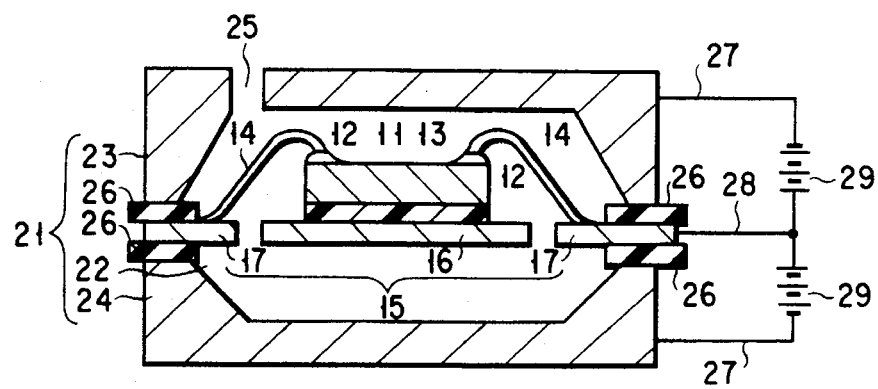
F I G. 2
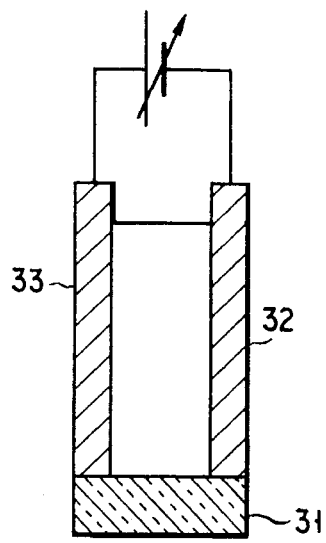
F I G. 3
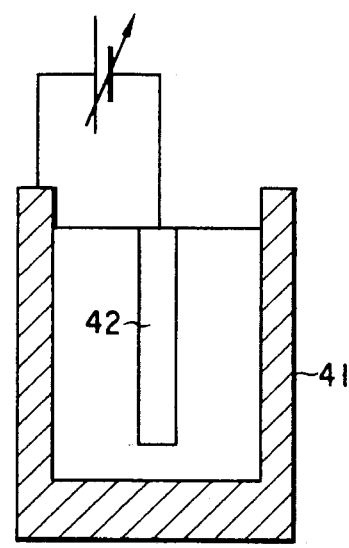
F I G. 4

METHOD OF MANUFACTURING A MOLDING USING A FILLER OR AN ADDITIVE CONCENTRATED ON AN ARBITRARY PORTION OR DISTRIBUTED AT A GRADIENT CONCENTRATION

This application is a continuation of application Ser. No. 08/198,262, filed on Feb. 18, 1994, now abandoned.

BACKGROUND OF THE INVENTION

1. Field of the Invention

The present invention relates to a method of manufacturing a molding and, more particularly, to a method of manufacturing a molding in which a filler or an additive is concentrated on an arbitrary portion or distributed at a gradient concentration to improve the properties of the molding or to impart a new function to the molding.

2. Description of the Related Art

It has been known that the physical properties such as mechanical strength, heat resistance, and electrical characteristics of the molding can be improved by mixing various fillers in a resin. In this technique, by changing the types, amounts, and the like of the fillers properly in accordance with its applications, the properties of the obtained molding can be controlled.

According to a recent attempt, the physical properties of the molding also can be improved or a new function can be imparted by changing the concentration of a filler gradiently in the molding. However, a proper method of so changing the concentration of the filler in the molding has not been found.

In addition, in the conventional resin compositions, various additives such as a mold release agent, a flame retardant, an adhesion imparting agent, and an antistatic agent are uniformly dispersed into the resins. In this case, the additives, for example, the mold release agent cannot perform a mold release effect if the mold release agent is not precipitated on the surface of the molding. However, an effective method to precipitate the mold release agent has not been found. For this reason, an excessive mold release agent addition into the resin composition is unavoidable. However, the mold release agent not only improves the mold release characteristics of the molding but also reduces adhesion properties, therefore the excessive mold release agent is not preferably added. Such a problem is posed by not only the mold release agent but also the flame retardant, the adhesive imparting agent, and the antistatic agent. Therefore, a molding method capable of precipitating an arbitrary additive at an arbitrary portion such as an interface between a molding and a mold or an insert without excessively adding the additive has been strongly demanded.

SUMMARY OF THE INVENTION

It is an object of the present invention to provide a method capable of easily manufacturing a molding in which a filler is distributed at a gradient concentration to improve the properties of the molding.

It is another object of the present invention to provide a molding method in which not only a filler but also various additives are effectively, selectively concentrated on an arbitrary portion to improve the properties or to impart new functions to the molding product.

According to the present invention, there is provided a method of manufacturing a molding, comprising applying a DC voltage to a liquid resin composition containing an ionic material and/or a chargeable material, and then solidifying the liquid resin composition. More specifically, before the resin composition is solidified, due to the electric potential applied to the resin, a filler or various ionic additives which are uniformly dispersed in a liquid resin are moved to an arbitrary portion, and as a result the concentrations of the filler and/or additives are continuously and gradiently varied inside the molding.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates presently preferred embodiments of the invention and, together with the general description given above and the detailed description of the preferred embodiments given below, serves to explain the principles of the invention.

FIG. 1 is a view showing the structure of a coil consisting of an aluminum wire and used as an insert in an embodiment of the present invention;

FIG. 2 is a view showing a mold and a semiconductor chip used in forming a semiconductor package which is encapsulated with a resin according to another embodiment of the present invention;

FIG. 3 is a view showing a mold used in another embodiment of the present invention; and FIG. 4 is a view showing a mold used in another embodiment of the present invention.

DETAILED DESCRIPTION OF THE PREFERRED EMBODIMENTS

According to a method of the present invention, a compound of low viscosity thermosetting or thermoplastic resin which comprises of ionic material and/or chargeable material are prepared first. The obtained resin composition is then injected or pouring into a mold having a predetermined inner shape, and a DC voltage is applied to the resin composition in this mold. At this time, due to the DC voltage the concentration of the ionic material and/or chargeable material in the resin composition will vary gradiently and continuously. Thereafter, the molding with a predetermined shape is obtained by heating to cured the resin if the resin composition is thermosetting, or by cooling or the like to solidify the resin if the resin composition is thermoplastic. In this molding, the ionic material and/or chargeable material is distributed gradiently from one side to the other side, and the properties of the molding are considerably improved due to the change in concentration distribution. Therefore, a new function can be imparted to the molding.

In the method according to the present invention, as the resin used as a main component of the material of the molding, i.e., the resin composition, both of thermosetting or thermoplastic resin can be used. Examples of the thermosetting resin are an epoxy resin, a polyester resin, a phenolic resin, and a maleimide resin and etc. Note that a hardener (e.g., phenol compounds, amine compounds, acid anhydride and etc.) or an accelerator (e.g., imidazole compounds, organic phosphine compounds, organic metal compounds amine compounds are etc.) can be added to the thermosetting resin, particularly to an epoxy resin, if needed. Of these accelerators, it is preferable to use a latent catalyst for the reason that it not deteriorate the volume resistivity of the resin composition as described hereinafter. Specific examples of such latent catalyst are NOVACURE™ (microcapsule-type latent catalysts, manufactured by Asahi Chemical Industry Co., Ltd.) and AMICURE™ manufactured by Ajinomoto Co., Inc.. Examples of the thermoplastic resin are a polyethylene resin, a polystyrene resin, a polypropylene resin, an ABS (acrylonitrile-butadiene-styrene) resin, a PPS (polyphenylene sulfide) resin and etc.

As the chargeable material mixed in the resin compound, for example, a filler can be used. As the filler, a nonconductive inorganic or organic filler can be preferably used. Examples of the nonconductive inorganic filler are powders of silica, alumina, aluminum hydroxide, titanium oxide, silicon nitride, aluminum nitride, clay, talc, and glass. Examples of the nonconductive organic filler are powders of a polyethylene resin, an acrylic resin, an epoxy resin, a phenolic resin, a nylon resin and etc. In addition, a metal powder such as an iron, copper, or silver which is coated or treated to make the surface to be chargeable can be used.

In the present invention, the amount of filler is preferably set to fall within a range of 5 to 80 V %, and more particularly, 30 to 60 V % in the total amount of resin and filler described above. This is because, when the amount of filler is excessively small, a variation in concentration distribution of the filler in the molding is small, and a long time may be required to vary the concentration distribution of the filler; when the amount of filler is excessively large, the viscosity of the resin composition excessively increases, and the flowability of the resin composition tends to decrease.

Various additives such as a flame retardant, a flame retardant assistant, a mold release agent, a pigment, a surface treating agent for filler, and a low-stress imparting agent, a diluent, and a solvent may also be mixed into the resin composition as needed.

As the ionic material mixed in the resin composition of the present invention, anions which have negative charge or cations which have positive charge may be used. Any ions which can be migrated by a DC voltage can be used as the ionic material. Examples of the ionic material are various salts, inorganic and organic acids, an ionic surfactant, a metal complex, an amine compound, and a coupling agent. Although the amount of ionic material mixed in the resin composition is properly selected in accordance with the properties of the ionic material, this amount may fall within a range of about 0.0001 to 5% in the total amount of resin composition. When the amount of ionic material is less than 0.0001%, an enhanced effect cannot be obtained by adding the ionic material. When the amount exceeds 5%, and a voltage is applied, an excessive amount of additive migrates to the interface between a molding and an electrode or an insert to form a layer having an excessive thickness, and the layer may cause a trouble.

In accordance with the present invention, it is possible to distribute not only an ionic material added as additives in the manner described above but also an ionic material previously existing in a resin composition into a molding in a desirable distribution state to impart a desirable property to the molding. For example, a raw material of epoxy resin normally contains chlorine ions in a concentration of several hundreds ppm. The chlorine ions can be migrated to the surface of the molding by applying a voltage to the resin to exhibit, for example, an antistatic effect or an corrosion inhibiting effect for a resin encapsulated substance.

In order to efficiently migrate the chargeable material, the resin composition preferably has a volume resistivity of $10^6$ $\Omega \cdot cm$ or more while a voltage is applied. When the volume resistivity is lower than $10^6$ $\Omega \cdot cm$, charges accumulated on the surface of the material are easily dissipated. Even if a voltage is applied, the material migrates slowly and may not be practically used. Note that the volume resistivity is measured as follows. That is, a resin is put between plate electrodes having an interval of 1 cm, a DC voltage of 100 V is applied across the electrodes, a resistance R between the electrodes is measured, and a value $\rho_v$ is calculated on the basis of the measurement value by the following equation:

$$\rho_v = SR/d$$

(where $\rho_v$ is a volume resistivity; R, the measured resistance; d, the interval between electrodes and S, the area of the electrodes)

The principle of migration of the ionic material is different from that of migration of the chargeable material, and the migration of the ionic material is not affected by a change in resistivity of a medium, so that the ionic material always has an almost constant charge. Therefore, the ionic material is not subjected to the condition described above.

In the method according to the present invention, although the DC voltage applied to the resin composition can be properly set in consideration of factors such as the shape and size of a molding to be obtained, the viscosity and electrical resistance of a resin or a resin composition to be used, and the charged state of the chargeable material, the DC voltage is preferably set within a range of about 1 V to 10 kV. When the DC voltage is lower than 1 V, a long time may be required to vary the concentration distribution of the chargeable material; when the DC voltage is higher than 10 kv, a complex, high voltage applying apparatus and the like are required, and the production cost may increase.

Note that the application of the DC voltage can be performed while the voltage is set to be a constant voltage, while the voltage is initially set to be a low voltage and gradually increased, or while the voltage initially set to be a high voltage and gradually decreased. In addition, a variation in concentration of the chargeable material depends on the value of the DC voltage and an application time. Thus, data on these factors and, if necessary, data such as the temperature of the resin composition is input to a computer, and the DC voltage is applied on the basis of the input data. In this manner, the concentration of the chargeable material in the resin composition can be gradiently varied in an optimal state.

As a method of applying the above DC voltage, for example, a method in which a dummy electrode is inserted into a liquid resin composition injected into a mold or the like and the voltage is applied through the electrode, a method in which part of a mold is used as an electrode and the voltage is applied through the electrode, or the like is used. In the former method, the electrode is removed from the resin composition after the voltage is applied, and a molding operation is sequentially performed.

The method according to the present invention can be more preferably applied to the manufacture of a molding incorporated with an insert consisting of a hard material or the like. A method of manufacturing such molding will be described below in detail.

In the molding incorporated with an insert, since an internal stress generally acts on the interface between the resin and insert in accordance with the glass transition temperature of the resin or the difference between the thermal expansion coefficients and elastic modulus of the resin and the insert, cracks are known to be formed from this interface, thereby manufacturing a defective product. As a countermeasure against the cracks, the following attempts are performed. For example, a large amount of filler described above is mixed in the resin to match the thermal expansion coefficient of the resin to the thermal expansion coefficient of the insert, or a low-stress imparting agent such as a proper plasticizer or a rubber component is mixed into the resin to decrease the elastic modulus and glass transition temperature of the resin. However, when a large amount of filler is mixed in the resin, high viscosity of the resin composition (plastic compound) and degradation of flowability of the resin composition are caused, and workability of injection and molding is degraded. In addition, since a decrease in elastic modulus or glass transition temperature of the resin degrades the heat resistance and mechanical strength of the molding, the decrease in elastic modulus or glass transition temperature is not preferable.

In consideration of the above points, in recent years, a method of interposing a stress relaxation layer constituted by a thermoplastic resin sheet or an elastic member such as a rubber sheet having a proper thickness between the resin and the insert is proposed as a new method of reducing cracks occurring in the molding. However, according to this method, the processing of forming the stress relaxation layer is needed, and the physical properties of the stress relaxation layer, the resin, and the insert are largely different from each other. For this reason, it is very difficult to match the physical properties of the materials.

In contrast to this, by applying the present invention to the manufacture of a molding incorporated with an insert, i.e., applying a DC voltage to a liquid resin composition incorporated with an insert in a mold and then solidifying the resin composition, the concentration distribution of a chargeable material such as a filler in the molding gradiently varies, thereby forming a layer in which the concentration of the chargeable material is high especially near the interface between the resin and the insert. In this molding, since the formed layer containing the filler having the high concentration functions as the stress relaxation layer to reduce the internal stress near the surface of the insert, cracks are prevented. Although the range of concentration distribution obtained when the concentration distribution of the chargeable material gradiently varies as described above is properly selected depending on the shape, size, and required characteristics of the molding, a difference between the maximum concentration of the material in the molding and the average concentration of the material in the molding is preferably set to be about 5% or more. Note that the maximum value of the concentration of the chargeable material in the molding means the average concentration of the material in a range falling within 500 μm from the interface between the resin and the insert.

In the molding described above, an electrically conductive material, for example, a metal material such as iron, steel, aluminum, stainless steel, gold, silver, copper, nickel, various alloys, or a coated material having an electrically conductive surface, or a semiconductor material such as a germanium-based material or a silicon-based material and having an electrical resistance of about $10^{10}$ Ω·cm or less, and more preferably, $10^6$ Ω·cm or less can be used as the insert. In addition, the insert may have a cylindrical shape, a rod-like shape, a plate-like shape, spherical shape, a parallelopiped shape, or the like. In addition, the insert may be set in any position such as the central or edge portion of the molding in accordance with the application or desired characteristics of the molding, and a plurality of inserts may be set in various positions in one molding. Examples of the insert are conducting insert of various bushings used in a heavy electric machine or the like, a coil of a molded transformer, a nut or bolt buried in an insulator, the aluminum coil used in ground coil for linear motor car, various bushings for mounting and fixing the coil, a lead frame and an element in a semiconductor mold package, and the like.

When the method of the present invention is to be applied to the manufacture of a molding incorporated with an insert, a DC voltage can be applied to the resin composition by using the insert as an electrode. In this case, the polarity of the insert be selectively set in accordance with the charged state of a chargeable material. For example, when the material is negatively charged, the insert is used as an anode, and a dummy electrode or a mold is used as a cathode; when the material is positively charged, vice versa. In addition, when the polarity of the insert is set as described above, and an inverted voltage is applied, the concentration of the chargeable mater can be increased near the outer surface of the resin in the finally obtained molding, and a specific function can be imparted to the molding. For example, alumina having a high hardness, hydrated aluminum having excellent flame retardancy, or silicon nitride having a high thermal conductivity is used as the filler, and the filler is distributed at a high concentration near the outer surface of the resin of the molding, thereby improving the performance such as the abrasion resistance, flame retardancy, and thermal conductivity, and the like of the surface of the molding.

The method of the present invention can be applied to form an organic thin film on substrate. In this case, an excellent concentration gradient thin film in which the filler and other additives are distributed at a gradiently varying concentration on the substrate can be obtained. When the organic thin film is formed on a conductive or semiconductor substrate, and the DC voltage is to be applied, the substrate may be used as an electrode.

Examples of the present invention will be described below in detail.

EXAMPLE 1

100 parts by weight of a bisphenol A epoxy resin (epoxy equivalent: 189), 80 parts by weight of a methyl hexahydrophthalic anhydride, 2 parts by weight of a microcapsule type latent catalyst (NOVACURE™, HX3742), 150 parts by weight of a silica filler having an average particle size of 4.5 μm, and 150 parts by weight of a silica filler having an average particle size of 20 μm were uniformly mixed with each other, thereby preparing a liquid epoxy resin composition. The volume resistivity of the resin composition was $4 \times 10^8$ Ω·cm at 60° C.

A coil serving as an insert was arranged in a mold not to be in contact with the inner surface of the mold, and the liquid epoxy resin composition was injected into the mold and heated to 60° C.

FIG. 1 is a view showing the structure of the coil used as an insert in this example. As shown in FIG. 1, this coil is formed by winding an aluminum wire having a width of 20 mm and a thickness of 2 mm along with an insulating paper such that the aluminum wire and the insulating paper are alternatively laminated.

After the liquid epoxy resin composition was deaerated in a vacuum, a DC voltage of 100 V was applied to the resin composition for 5 minutes respectively using the aluminum wire of the coil and the mold as an anode and a cathode. Subsequently, the resin composition was heated at 120° C. for 2 hours and at 150° C. for 10 hours to be cured, thereby obtaining a model coil which was subjected to an insulating treatment.

In this model coil, the surface hardness of the resin was measured by a Barcol hardness tester (GYZJ 934-1). A thermal cycle test having a temperature range from 0° C. to 100° C. and one hour per cycle was repeated, and a cycle count until resin cracks were formed was measured, thereby evaluating a crack resistance. The obtained result is shown in Table 1.

EXAMPLE 2

A model coil was formed following the same procedures as in Example 1 except that, after an epoxy resin composition was injected and deaerated in a vacuum, a DC voltage of 100 V was applied to the epoxy resin composition for 20 minutes. The surface hardness and crack resistance of the formed resin were evaluated. The obtained result is shown in Table 1.

tion was injected and deaerated in a vacuum, a DC voltage of 100 V was applied for 10 minutes using the aluminum wire of the coil and the mold respectively as a cathode and an anode. The surface hardness of the formed resin were evaluated. The obtained result is shown in Table 1.

COMPARATIVE EXAMPLE 1

A model coil was formed following the same procedures as in Example 1 except that, after an epoxy resin composition was injected and deaerated in a vacuum, no DC voltage was applied to the epoxy resin composition. The surface hardness and crack resistance of the formed resin were evaluated. The obtained result is shown in Table 1.

COMPARATIVE EXAMPLE 2

A model coil was formed following the same procedures as in Example 1 except that, after an epoxy resin composition was injected and deaerated in a vacuum, an AC voltage of 100 V was applied to the epoxy resin composition for 20 minutes. The surface hardness and crack resistance of the formed resin were evaluated. The obtained result is shown in Table 1.

TABLE 1

| | | Example | | | | | Comparative Example | |
|---|---|---|---|---|---|---|---|---|
| | | 1 | 2 | 3 | 4 | 5 | 1 | 2 |
| Molding Condition | DC Voltage (V) | 100 | 100 | 100 | 1000 | 100 | No voltage is applied | 100 (Ac) |
| | Application Time (min.) | 5 | 20 | 30 | 5 | 10 | | 20 |
| | Setting of Polarity Coil/Mold | Anode Cathode | Anode Cathode | Anode Cathode | Anode Cathode | Cathode Anode | | |
| Physical Properties | Surface Hardness | 71 | 71 | 70 | 70 | 90 | 71 | 71 |
| | Crack Resistance (Cycle Count) | 8 | 9 | 11 | 14 or more | — | 1 | 1 |

EXAMPLE 3

A model coil was formed following the same procedures as in Example 1 except that, after an epoxy resin composition was injected and deaerated in a vacuum, a DC voltage of 100 V was applied to the epoxy resin composition for 30 minutes. The surface hardness and crack resistance of the formed resin were evaluated. The obtained result is shown in Table 1.

EXAMPLE 4

A model coil was formed following the same procedures as in Example 1 except that, after an epoxy resin composition was injected and deaerated in a vacuum, a DC voltage of 1,000 V was applied to the epoxy resin composition for 5 minutes. The surface hardness and crack resistance of the formed resin were evaluated. The obtained result is shown in Table 1.

EXAMPLE 5

A model coil was formed following the same procedures as in Example 1 except that, after an epoxy resin composi- As is apparent from the results in Table 1, in each of the molding (model coils) obtained in Examples 1 to 4, a crack resistance was improved. In addition, in the molding (model coil) obtained in Example 5, the surface hardness of the molding considerably increased.

EXAMPLE 6

In this example, a semiconductor chip was encapsulated with a resin in a mold, thereby forming a semiconductor package.

FIG. 2 is a schematic view showing the arrangement of the semiconductor chip and a mold used in this example. As shown in the figure, a semiconductor chip 11 (chip size: 15 mm×15 mm×0.45 mm) was mounted on a die pad 16 (bed size: 15.5 mm×15.5 mm×0.15 mm) of a lead frame 15 by a mounting agent 13, and bonding pads 12 formed on the semiconductor chip 11 were electrically connected to a lead portion 17 of the lead frame 15 by bonding wires 14. This lead frame 15 was arranged in a cavity 22 of a mold 21 such that the lead portion 17 was sandwiched by upper and lower molds 23 and 24 with insulating paper 26 interposed. The upper and lower molds 23 and 24 were electrically connected to a DC power supply 29 by wiring lines 27, and the lead portion 17 of the lead frame 15 was electrically connected to the DC power supply 29 by a wiring line 28.

After the liquid epoxy resin composition prepared in Example 1 was injected from an inlet port 25 of the upper mold 23 into the cavity 22 and heated to 60° C., the DC power supply 29 was driven to apply a DC voltage of 100 V for 20 minutes using the lead frame 15 and the mold 21 respectively as an anode and a cathode. The resin composition in the cavity 22 was heated at 120° C. for 2 hours and at 150° C. for 10 hours and hardened, thereby obtaining a semiconductor package (QFP 184 pins) in which the semiconductor chip 11 was encapsulated with the resin.

A large number of semiconductor packages were formed in the same manner as described above, a thermal cycle test having a temperature range from −60° C. to 150° C. and requiring one hour per cycle was repeated, and 20 semiconductor packages were picked every predetermined number of cycles. The section of the resin of each picked semiconductor package was observed to check if internal cracks were formed. The obtained result is shown in Table 2.

COMPARATIVE EXAMPLE 3

Semiconductor packages were formed following the same procedures as in Example 6 except that, after an epoxy resin composition was injected and heated in a vacuum, no DC voltage was applied. The internal cracks of the resin were examined after the thermal cycle testes described in Example 6. The obtained result is shown in Table 2.

TABLE 2

| | | | Example 6 | Comparative Example 3 |
|---|---|---|---|---|
| Molding Condition | DC Voltage (V) Application Time (min.) | | 100 20 | No voltage is applied |
| | Setting of Polarity | Frame Mold | Anode Cathode | |
| Thermal Cycle Test QFP 184 pin (failure Sample Count/All Sample Count) | −60° C. to 150° C. | 100 cycle 200 cycle 300 cycle 500 cycle | 0/20 0/20 0/20 0/20 | 0/20 5/20 11/20 20/20 |

As is apparent from the results in Table 2, in the molding (semiconductor packages) obtained in the example of the present invention, a crack resistance was improved by applying the DC voltage in the manner as described above.

EXAMPLE 7

100 parts by weight of a bisphenol A type epoxy resin (epoxy equivalent: 189), 80 parts by weight of a methyl hexahydrophthalic anhydride, 0.2 parts by weight of an imidazole catalyst (2E4MZ-CN, available from Shikoku Chemicals Corp.), 100 parts by weight of a silica filler having an average particle size of 4.5 μm, and 100 parts by weight of a silica filler having an average particle size of 20 μm were uniformly mixed with each other, thereby preparing a liquid epoxy resin composition. The volume resistivity of the resin composition was $5 \times 10^7$ Ω·cm at 60° C.

The obtained epoxy resin composition was injected into a mold having a plate cathode 32 and a plate anode 33 parallelly arranged through an insulator 31 at an interval of 10 mm as shown in FIG. 3, and a DC voltage of 100 V was applied across the cathode 32 and the anode 33 for 20 minutes while the epoxy resin composition was kept at a temperature of 60° C. Thereafter, the resin was heated at 120° C. for 2 hours and at 150° C. for 10 hours and cured.

The hardnesses of both the surfaces of the resin plate obtained as described above were measured by a Barcol hardness tester (GYZJ 934-1). The hardness of the surface adjacent to the cathode 32 was 85, and the hardness of the surface adjacent to the anode 33 was 65.

As is apparent from this result, when the voltage was applied across the electrodes, the negatively charged filler was moved on the anode side to cause the hardness of the surface adjacent to the anode to increase.

EXAMPLE 8

A liquid epoxy resin composition was prepared in the following the same procedures as in Example 7 except that 5 parts by weight of the imidazole catalyst was used. The volume resistivity of the resin composition was $4 \times 10^5$ Ω·cm at 60° C.

The obtained epoxy resin composition was injected into the mold shown in FIG. 3 as in Example 7, and voltage application, heat treatment, and measurement of the hardnesses of both the surfaces of the resin plate were performed in the same manner as in Example 7. As a result, the hardness of the surface adjacent to the anode was 69, and the hardness of the surface adjacent to the cathode was 67. Therefore, it is found that, the difference of the hardnesses between both the surfaces are small, the filler is moved at a low speed even when a voltage is applied, and thus an enhanced effect obtained by the voltage application was small.

EXAMPLE 9

90 parts by weight of a bisphenol A type epoxy resin (Epikote 828, epoxy equivalent: 189, available from Yuka Shell), 10 parts by weight of a brominated epoxy resin (Epicron 152, epoxy equivalent: 360, bromine content: 47%, available from Dainippon Ink & Chemicals, Inc.), 80 parts by weight of a hardener of acid anhydride (methyl tetrahydrophthalic anhydride), 150 parts by weight of a fused silica (Toshiba Ceramics) having an average particle size of 4.5 μm, and 0.1 parts by weight of antimony trioxide were uniformly mixed with each other while heating by a mixer and then cooled to 50° C., and 3 parts by weight of a microcapsule type latent catalyst (HX 3742, available from Asahi Chemical Industry Co., Ltd.) were uniformly mixed into the resultant mixture, thereby preparing a resin composition. The volume resistivity of the resin composition was $3.5 \times 10^8$ Ω·cm at 60° C.

This resin composition was injected into a mold 41 shown in FIG. 4 and having a width of 12.7 mm, a length of 127 mm, and a thickness of 10 mm, and a dummy aluminum electrode 42 was inserted into the resin composition not to be in contact with the mold 41. In this state, a DC voltage of 100 V was applied for 10 minutes using the mold 41 and the dummy aluminum electrode 42 respectively as a anode and an cathode. Thereafter, the dummy aluminum electrode 42 was removed, and then the resin composition was heated at 120° C. for 3 hours and cured, thereby forming a molding.

The flame retardancy of the obtained molding was examined to be UL94V-0.

COMPARATIVE EXAMPLE 4

A molding was formed following the same procedures as in Example 9 except that no DC voltage was applied, and the flame retardancy of the obtained molding was examined to be UL94HB.

As is apparent from Example 9 and Comparative Example 4, according to the manufacturing method of the present invention, a resin having good flame retardancy can be obtained using bromine and antimony trioxide in small amounts which may not achieve excellent fire retardancy of the resin in the conventional manufacturing method. That is, according to the manufacturing method of the present invention, the contents of toxic compounds such as bromine and antimony trioxide used in the resin can be considerably reduced.

EXAMPLE 10

0.01 parts by weight of Denon 34C (cationic surfactant, available from Maruzen Petrochemical Co., Ltd.) serving as an antistatic agent was uniformly dispersed into 100 parts by weight of a thermoplastic resin (polyethylene) at 200° C. to prepare a resin composition. This resin composition was injected into the mold shown in FIG. 4 and used in Example 9, and a dummy aluminum electrode was inserted into the resin composition not to be in contact with the mold. Thereafter, a DC voltage of 600 V was applied across electrodes for 30 seconds using the mold and the dummy electrode respectively as a cathode and an anode. The dummy electrode was then removed, a molding was formed by rapid cooling, and the charging properties of the surface of the molding were examined.

The charging properties were determined on the basis of attraction of dust. That is, the charging properties were Judged whether the molding which was rubbed by cotton attracted cigarette ash. As a result, the molding did not attract the ash.

COMPARATIVE EXAMPLE 5

A molding was manufactured and the charging properties of the molding were determined following the same procedures as in Example 10 except that no DC voltage was applied. As a result, the molding attracted a large amount of ash.

As is apparent from Example 10 and Comparative Example 5, according to the manufacturing method of the present invention, good antistatic properties can be achieved using an antistatic agent in a small amount which may not achieve good antistatic properties in a conventional manufacturing method.

EXAMPLE 11

A semiconductor package was formed following the same procedures as in Example 6 except that an application time of a DC voltage applied after an epoxy resin composition was injected and heated was set to be 30 seconds, as well as the mold itself was set as an anode.

In order to measure the amount of impurity ions in the resin, the resin adjacent the chip (inner side) as well as the resin adjacent the mold (outer side) was finely ground, and the respectively subjected to extraction in distilled water at 180° C. for 2 hours in a closed container under pressure of 10 atm. Thereafter, the amount of halogen was measured.

As a result, the amount of halogen at inner side of the package was 10 ppm, and the amount of halogen at outer side of the package was 245 ppm.

COMPARATIVE EXAMPLE 6

The amounts of halogens at inner and outer sides of semiconductor package were measured in the same manner as in Example 11 except that no DC voltage was applied after an epoxy resin composition was injected and heated.

As a result, the amounts of halogens at inner and outer sides of the package were 115 ppm.

As is apparent from Example 11 and Comparative Example 6, according to the manufacturing method of the present invention, impurities such as halogens inherent in the resin composition can be expelled to the outer side of the semiconductor package. Therefore, an impurity ion concentration at inner side of the package decreases, the chip can be prevented from corrosion, and the reliability of the semiconductor package can be improved. An antistatic effect can also be obtained.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a molding, which comprises the steps of:

injecting a liquid resin composition containing at least one of an ionic material and a chargeable material into a mold;

applying a DC voltage to the liquid resin composition to make said at least one of the ionic material and the chargeable material migrate, thereby forming a concentration gradation of said at least one of the ionic material and chargeable material in the liquid resin composition, the liquid resin composition being in a liquid state while the DC voltage is being applied; and solidifying the liquid resin composition.

2. A method of manufacturing a molding, comprising the steps of:

applying a DC voltage to a liquid resin composition containing a chargeable material to make the chargeable material migrate, thereby forming a concentration gradation of the chargeable material in the liquid resin composition, the liquid resin composition being in a liquid state while the DC voltage is being applied; and solidifying the liquid resin composition.

3. A method according to claim 2, wherein the charged material is a nonconductive filler.

4. A method according to claim 3, wherein a volume resistivity of the liquid resin composition is not less than $1 \times 10^6$ Ω·cm.

5. A method according to claim 4, wherein the resin composition is injected into a mold having a pair of electrodes, which is insulated from each other, and a DC voltage is applied across said pair of electrodes.

6. A method according to claim 4, wherein the resin composition is injected into a mold having an electrode, and another electrode is inserted into the resin composition not to be in contact with the mold, and a DC voltage is applied across said electrodes.

7. A method according to claim 4, wherein the DC voltage ranges from 1 V to 10 kV.

8. A method according to claim 4, wherein an amount of the filler in a total amount of the resin composition compound is 5 to 80 V %.

9. A method according to claim 4, wherein the resin composition is a thermosetting or thermoplastic resin selected from the group consisting of an epoxy resin, a polyester resin, a phenolic resin, a maleimide resin, a polyethylene resin, a polystyrene resin, a polypropylene resin, an ABS resin, and a PPS resin.

10. A method according to claim 1, wherein the resin composition comprises an epoxy resin, a hardener for the epoxy resin and a latent catalyst.

11. A method according to claim 4, wherein the filler is an inorganic or organic filler selected from the group consisting of silica, alumina, aluminum hydroxide, titanium oxide, silicon nitride, aluminum nitride, clay, talc, glass, a polyethylene resin, an acrylic resin, an epoxy resin, a phenolic resin, a nylon resin, and a metal powder whose surface is coated or treated with a nonconductive material.

12. A method of manufacturing a molding, comprising the steps of:

applying a DC voltage to a liquid resin composition containing an ionic material to make the ionic material migrate, thereby forming a concentration gradation of the ionic material in the liquid resin composition, the liquid resin composition being in a liquid state while the DC voltage is being applied; and solidifying the liquid resin composition.

13. A method according to claim 12, wherein the resin composition is injected into a mold having a pair electrodes, and the DC voltage is then applied across said pair of electrodes.

14. A method according to claim 12, wherein the resin composition is injected into a mold having an electrode, and another electrode is inserted into the resin composition not to be in contact with the mold, and the DC voltage is applied across said electrodes.

15. A method according to claim 12, wherein the DC voltage ranges from 1 V to 10 kV.

16. A method according to claim 12, wherein an amount of the ionic material in a total amount of the resin composition is 0.0001 to 5 wt %.

17. A method according to claim 12, wherein the resin composition is a thermosetting or thermoplastic resin selected from the group consisting of an epoxy resin, a polyester resin, a phenolic resin, a maleimide resin, a polyethylene resin, a polystyrene resin, a polypropylene resin, an ABS resin, and a PPS resin.

18. A method according to claim 12, wherein the ionic material is selected from the group consisting of a salt, inorganic and organic acids, an ionic surfactant, a metal complex, an amine compound, and a coupling agent.

* * * * *